United States Patent [19]
Streckert et al.

[11] Patent Number: 6,134,972
[45] Date of Patent: Oct. 24, 2000

[54] AIR DATA SENSING PROBE WITH CHROMIUM SURFACE TREATMENT

[75] Inventors: Holger H. Streckert, San Diego; Paul W. Trester, Encinitas, both of Calif.

[73] Assignee: Rosemount Aerospace, Inc., Brecksville, Ohio

[21] Appl. No.: 08/486,514

[22] Filed: Jun. 7, 1995

Related U.S. Application Data

[62] Division of application No. 08/390,777, Feb. 17, 1995, Pat. No. 5,543,183.

[51] Int. Cl.$^7$ .............................. G01F 1/46; C25D 11/02
[52] U.S. Cl. ......................................... 73/861.65; 428/629
[58] Field of Search ................................... 428/629, 632, 428/680; 73/861.65

[56] References Cited

U.S. PATENT DOCUMENTS

| | | | |
|---|---|---|---|
| 1,578,254 | 3/1926 | Bennett | 428/629 |
| 2,823,139 | 2/1958 | Schulze et al. | 428/629 |
| 3,837,894 | 9/1974 | Tucker | 428/632 |
| 3,969,153 | 7/1976 | Suzuki et al. | 148/6.35 |
| 4,055,706 | 10/1977 | Galmiche et al. | 428/652 |
| 4,097,351 | 6/1978 | Caley et al. | 204/181 |
| 4,298,661 | 11/1981 | Ikeno et al. | 428/629 |
| 4,378,696 | 4/1983 | DeLeo et al. | 73/180 |
| 4,483,324 | 11/1984 | Fromm | 126/439 |
| 4,501,802 | 2/1985 | Higuchi et al. | 428/629 |
| 4,522,070 | 6/1985 | Hagen | 73/384 |
| 4,608,320 | 8/1986 | Mochizuki et al. | 428/629 |
| 4,615,213 | 10/1986 | Hagen | 73/180 |
| 4,730,487 | 3/1988 | DeLeo et al. | 73/182 |
| 4,764,747 | 8/1988 | Kurtz et al. | 338/2 |
| 4,851,095 | 7/1989 | Scobey et al. | 204/192.12 |
| 4,895,576 | 1/1990 | Pal et al. | 29/623.5 |
| 4,985,313 | 1/1991 | Penneck et al. | 428/627 |
| 5,079,100 | 1/1992 | Descamp et al. | 428/632 |
| 5,316,866 | 5/1994 | Goldman et al. | 428/632 |
| 5,320,909 | 6/1994 | Scharman et al. | 428/629 |
| 5,419,971 | 5/1995 | Skelly et al. | 428/632 |
| 5,480,730 | 1/1996 | Swisher | 428/621 |

FOREIGN PATENT DOCUMENTS

| | | |
|---|---|---|
| 4222026 | 4/1993 | Germany . |
| 287194 | 3/1928 | United Kingdom . |
| 1018628 | 1/1966 | United Kingdom . |

OTHER PUBLICATIONS

CRC Handbook of Chemistry and Physics, Chemical Rubber Corporation Press, NY, pp. 12–172–12–173.

Webster's II New Riverside University Dictionary, Houghton Mifflin Company 1994.

Brown, et al., "Novel Metal Ion Surface Modification Technique", *Appl. Phys. Lett.*, 58:13, pp. 1392–1394 (Apr. 1, 1991).

"Metallurgical Coatings 1984", *Proceedings of the International Conference on Metallurgical Coatings*, San Diego, California (Apr. 9–13, 1984).

Bulletin 1013 "Pitot and Pitot–Static Probes", BF Goodrich Aerospace, Rosemount Aerospace Brochure 1013, pp. 2–11, (Rev. Dec. 1994).

Bulletin 1014, "Model 858 Flow Angle Sensors", BF Goodrich Aerospace, Rosemount Aerospace Brochure 1014, pp. 2–7, (Rev. Nov. 1994).

*Primary Examiner*—Hezron Williams
*Assistant Examiner*—Jay L. Politzer
*Attorney, Agent, or Firm*—Fitch, Even, Tabin & Flannery

[57] ABSTRACT

A method for applying a chromium surface treatment to nickel-based air data sensors to improve the corrosion resistance properties of the components while retaining thermal conductivity in order to efficiently transfer internally generated heat to the exterior of the component during anti-icing or deicing procedures is provided. The method for applying a chromium surface treatment to nickel-based air data sensors includes the steps of: (a) ion plating a nickel-based substrate with chromium atoms using a physical vapor deposition process; (b) interdiffusing the chromium and the nickel atoms at the surface region by means of a first thermal treatment carried out in an inert environment; and (c) oxidizing the chromium atoms at the surface region to create a chromium oxide layer during a second thermal treatment performed in an oxygen-containing environment.

18 Claims, 3 Drawing Sheets

AIR DATA SENSING PROBE WITH CHROMIUM SURFACE TREATMENT

This application is a divisional of U.S. application Ser. No. 08/390,777 filed Feb. 17, 1995, now U.S. Pat. No. 5,543,183.

The present invention relates to an improved surface treatment of nickel-based substrates, and more particularly to a method of applying a chromium surface treatment to nickel-based substrates that provides enhanced corrosion resistance while retaining the thermal conductivity and other preferred mechanical properties of the nickel-based substrate.

BACKGROUND OF THE INVENTION

Certain aerospace components such as pitot probes, pitot-static probes, temperature sensors, and other air data sensors or probes have a critical need to efficiently transfer heat from internally placed heater coils to the exterior of the component during anti-icing or deicing procedures. For that reason, many of these components are typically made from nickel or high nickel content alloys. Although nickel generally demonstrates relatively good corrosion resistance, over time, such nickel components do exhibit some corrosion and subsequent erosion due to constant exposure of moisture, oxidants, halide salts, sulfur-bearing gases, soot, particle impingement, cleaning fluids and many other corrosive solutions.

Because of the importance of air data sensors to aircraft navigation and control, there has been much effort directed to the design and fabrication of air data sensors that are both small and reliable. Various types of air data sensors are disclosed, for example, in U.S. Pat. Nos. 4,730,487; 4,615,213; 4,522,070; and 4,378,696 the disclosures of which are herein incorporated by reference. There remains however, a continuing need for air data sensors or probes that retain thermal conductivity and more importantly exhibit improved corrosion resistance properties.

It is well known that chromium is often used in order to enhance the strength and corrosion resistance of various metal components. Chromium surface treatments, such as chromium coatings, often improve the reliability, maintainability and quality of many products by providing resistance to corrosion, thermal insulation, as well as environmental shielding. Chromium surface treatments on various substrates are also practiced in order to realize a more decorative surface appearance in addition to providing a corrosion or wear resistant surface.

Electroplating of chromium is the most utilized form of surface treatment involving chromium. Chromium plating includes both decorative chromium plating as well as hard chromium plating. Hard chromium plating differs from the decorative plating, mostly in terms of the thickness of the chromium applied. Hard chromium plating may be ten to several hundred $\mu$m thick, whereas chromium layers used in the decorative plating process may be as thin as 0.25 $\mu$m. Hard chromium plating is noted for its excellent hardness, wear resistance and a low coefficient of friction. Decorative chromium plating on the other hand retains its brilliance because air exposure or other oxidizing exposure immediately forms an invisible protective chromium oxide film.

Chromizing is another principal method of obtaining a chromium rich surface on substrates. In a typical chromizing process, chromium is diffused into the metal substrate from a packed bed in a furnace at about 1100° C. to produce an effective combination or solid solution of the chromium and the substrate metal or alloy being chromized. The thickness of the chromium surface treatment can be controlled by the length of time of the furnace treatment. Chromizing is an economical process that improves corrosion resistance of many components, such as turbine blades, where the appearance is typically not an important consideration. However, chromizing typically does not yield a surface morphology that is aerodynamically smooth enough for external air data sensors.

Other less utilized chromium surface processes include ion implantation, sputtering, chemical vapor deposition, physical vapor deposition and metal spraying. The related art concerning ion implantation processes are described in articles by Sioshansi "Ion Beam Modification of Materials For Industry", *Thin Solid Films*, Vol 118 pp 61–71 (1984) and Brown et al. "Novel Metal Ion Surface Modification Technique", *Appl. Phys. Lett.*, Vol 58, No. 13 (1991). As discussed in the Sioshansi article, ion implantation of chromium has previously been used for improving the service life and performance of precision steel bearings.

Very generally, ion implantation is a process for electrically injecting atoms of one element into a selected target of another material and more particularly a process for injecting the ions to selected depths and in selected concentrations in order to produce an alloy or other solid mixture having a different composition from the original target material and therefore exhibiting different and sometimes highly desirable chemical and physical properties.

Ion plating, on the other hand, is a process whereby a coating material is evaporated in the plasma region of a gas discharge, ionized, and physically accelerated toward the substrate under influence of electric fields. The ionized particles are deposited on clean surfaces of the substrate with high energy to penetrate the surface and form coatings with uniform thickness, exhibiting excellent adhesion characteristics. The ion plating process is typically carried out in a low pressure chamber which has two properly spaced electrodes. When more energy is available via an applied voltage than the ionization energy of the gas molecules, a gaseous discharge takes place and current can be carried between the electrodes. Electrons ejected from a negative cathode are accelerated toward the positive anode, gaining energy from the electrical field. As the electrons travel toward the anode, some collide with gas molecules, giving up part of their energy to produce positive ions and extra free electrons as well as visible light. The heavy, slow moving positive ions remain in the space between the electrodes longer than the lighter high velocity electrons, giving a net positive space charge which in turn tends to further accelerate electrons from the cathode to produce a self-sustaining glow discharge.

If an ionizable material is evaporated in the plasma region of the discharge, while the above discharge is taking place, many of the evaporant atoms are struck by electrons and become ionized. They can then be accelerated to a second cathode. If the substrate to be coated is made the cathode, the positively charged evaporant ions follow electric field lines to impinge on the substrate surface with energy in electron-volts very nearly equal to the full anode to cathode potential. The evaporant ions are applied to the substrate surface and, at the same time, ionized gas atoms are removing material from the substrate surface by sputtering.

Nickel—chromium alloys will form a solid solution up to about approximately 30% weight chromium. Chromium is often added to nickel to enhance the strength, corrosion resistance, oxidation resistance, hot corrosion resistance and electrical resistance of the various components. In combination, nickel and chromium have been used to form nickel-based superalloys, such as Nichrome type alloys, which are well known and often utilized materials. These nickel-based superalloys, however, do not exhibit the preferred mechanical properties suitable for manufacturing air data sensors or probes. Compared to pure nickel, the nickel—chromium alloys also exhibit greatly reduced thermal transport properties and are less suitable for air data sensors or probes.

Accordingly, there is a need for an improved and reasonably economic method of applying chromium surface treatments to air data sensors and probes. The improved chromium surface treatments should offer improved corrosion resistance during operational use of the air data sensor or probe but allow the air data sensor or probe to retain the preferred mechanical properties for workability offered by conventional nickel-based air data sensors and probes. More importantly, the chromium surface treatment should be an economically feasible process.

SUMMARY OF THE INVENTION

The present invention provides a method for applying a chromium surface treatment to nickel-based aerospace components to improve the corrosion resistance properties of the components while retaining thermal conductivity in order to efficiently transfer internally generated heat to the exterior of the component during anti-icing or deicing procedures. The present method includes the steps of: ion plating a nickel-based substrate with chromium atoms using an ion-aided deposition process; thermally treating the chromium-plated nickel-based substrate in a generally inert environment to interdiffuse chromium and nickel atoms at a near surface region of the chromium-plated nickel-based substrate; and thermally treating the chromium-plated nickel-based substrate in an oxygen-containing environment to oxidize the chromium atoms at exposed surfaces and create a layer of chromium oxide. The thickness or build-up of chromium and chromium oxide is maintained thin enough to fall within a prescribed tolerance for functional operation of the components.

The method for applying a chromium surface treatment to nickel-based substrates can be used to satisfy the need for air data sensors or probes that exhibit improved corrosion resistance compared to conventional nickel sensors or probes and retain thermal conductivity in order to readily transfer heat from internally placed heater coils to the exterior surfaces of the air data sensor or probe.

BRIEF DESCRIPTION OF THE DRAWINGS

In the following detailed description, reference will be made to the attached drawings in which.

DETAILED DESCRIPTION OF THE INVENTION

Figure 1:
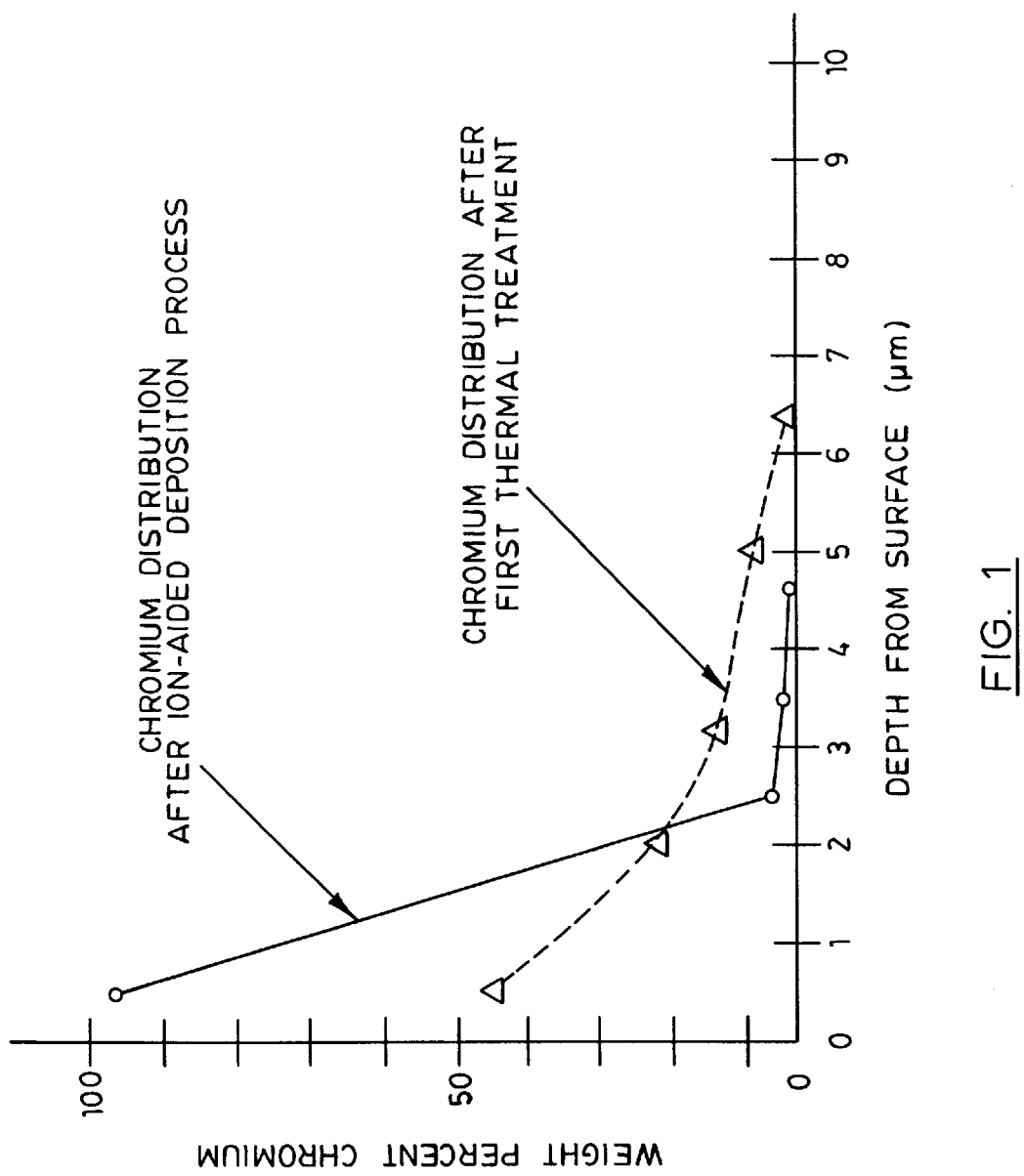
FIG. 1 is a graphical representation of the chromium and nickel distribution at the near surface region of the nickel-based substrate. The graph plots the chromium concentration relative to the depth from the surface after the ion-aided chromium deposit is applied and then again after the coated substrate undergoes a first thermal treatment diffusing the chromium further into the substrate and forming a nickel—chromium alloy.

The following description is of the best mode presently contemplated for carrying out the invention. This description is not to be taken in a limiting sense, but is made merely for the purpose of describing the general principles of the invention. The scope of the invention should be determined with reference to the claims.

The described method of applying a chromium surface treatment to nickel-based substrates or components advantageously provides enhanced corrosion resistance of the substrates or components while retaining the thermal conductivity and other preferred mechanical properties of the nickel-based substrate. The preferred method comprises three essential steps, the first of which involves plating the nickel-based substrate with chromium atoms using an ion-plating process. The ion-plating is followed by a first thermal treatment of the ion-plated substrate to diffuse the chromium atoms further into the nickel-based substrate. Specifically, the ion-plated substrate undergoes the first thermal treatment in an inert atmosphere to allow the chromium atoms and the nickel atoms to interdiffuse and form a nickel—chromium alloy at the surface region, without oxidation. The substrate is then subjected to a second thermal treatment in an oxygen-containing atmosphere to oxidize the chromium atoms at the surface region thereby creating a layer of chromium oxide.

This preferred three step method is particularly suitable for the chromium surface treatment of aerospace components such as pitot probes, pitot-static probes, multifunctional sensors, temperature sensors, and other air data sensors or probes. Many such probes and sensors are nickel-based components that must operate in a corrosive environment. In addition, the design configurations of many such probes and sensors are not conducive to many conventional chromium coating processes or surface treatment processes. For example, many of the sensors and probes, such as pitot probes, are typically designed with a comparatively large exterior surface and small openings or measurement ports. The walls of the openings or measurement ports are often inaccessible or difficult to treat yet must remain corrosion free to ensure reliable and accurate operation of the sensor or probe.

It is contemplated that other ion-aided deposition process can be utilized in lieu of the ion-plating process. Both ion-plating and other ion-aided deposition processes must effectively plate and/or implant sufficient chromium atoms on the component surface and the port walls of air data sensors and probes without interfering or adversely affecting the reliable operation of the sensor or probe. Moreover, the subsequent interdiffusion of nickel and chromium atoms allows the surface-treated air data sensors or probes to retain thermal conductivity in order to efficiently transfer heat from internally placed heater coils to the exterior of the sensor or probe during anti-icing or deicing procedures.

The nickel-based substrates or sensors are preferably formed from commercial nickel alloys of Inco Alloys International, Inc. such as Nickel 200 or Nickel 211 alloys, although other high nickel content alloys may be used. Nickel 200 contains a minimum of 99.5 weight percent of nickel; 0.25 maximum weight percent of manganese; and other minor impurities. Nickel 211 contains a minimum of 93.7 weight percent of nickel (plus cobalt) and 4.25 to 5.25 weight percent of manganese together with small weight percents of other impurities. Other nickel forms suitable for use with the present invention include, but are not limited to Nickel 201, Nickel 205, Nickel 220, Nickel 230, and Nickel 270.

The surfaces of the nickel-based substrates are initially cleaned prior to application of the chromium deposit. The preferred cleaning process includes both an ultrasonic cleaning process as well as washing in organic solvents. Specifically, the nickel-based substrates are subjected to an ultrasonic cleaning process while submersed in an alkaline solution, and then rinsed in distilled water. The nickel-based substrates are then removed and further cleaned by a two step washing procedure in organic solvents. The preferred washing technique includes washing in acetone followed by an ethanol bath. The nickel-based substrates are then removed and dried by evaporation or other suitable drying method.

The chromium deposit is applied by means of a physical vapor deposition technique which deposits chromium atoms at the surface or near surface region of the nickel-based substrate. The near surface region is that region of the nickel-based substrate immediately beneath the exterior surface of the substrate. Advantageously, the near surface region also corresponds to the region where an alloy of chromium and nickel are ultimately formed. The preferred techniques are ion-plating techniques, such as electron beam ion plating or cathodic arc ion plating, but may also include ion sputtering, ion implantation, ion beam mixing, or other metal ion deposition techniques.

The result of the ion-aided chromium deposition process is a chromium deposit on all exposed surfaces of the nickel-based substrate. In particular, about 0.5 $\mu$m to 5.0 $\mu$m of chromium is deposited on the exterior surface of the original nickel-based substrate. In addition some chromium penetrates into the original substrate. Less accessible surfaces, including the walls of openings and measurement ports, also receive a slightly thinner chromium deposit. These thinner deposits are on the order of preferably 0.1 $\mu$m or greater as measured from the original nickel-based substrate surface.

The preferred physical vapor deposition process is an electron beam or cathodic arc ion plating process produced in an ion plating chamber and is commercially available from various industrial plating sources. Process parameters such as gas pressure, anode to cathode voltage, and evaporation rate must be adjusted such that more evaporant ions are deposited on the substrate surface than are sputtered off by action of the incident ions. The plating action has the ability to reach all surfaces of the substrate, to varying degrees, and not just those surfaces in a line of sight path from the evaporant to the substrate.

The cleaned nickel-based substrates are placed in a plasma ion deposition vacuum chamber with a chromium electrode. A cloud of charged chromium ions is produced which subsequently deposited on the negatively biased nickel-based substrates at a voltage differential between the plasma and the substrate of approximately 1000–2000 volts. Evaporation of the chromium is begun and continues until the preferred coating thickness is obtained. Since the nickel-based substrate is directly exposed to the plasma it realizes a localized rise in temperature to about 400° C. or 500° C. at the surface. However, the ion plating process is controlled to prevent overheating of the bulk substrate. Evaporation and the gas discharge is then terminated and the nickel-based substrate is allowed to cool in the vacuum or in an inert gas atmosphere. An important aspect of the present process is that the ion plating process yields a chromium deposit with good adherence, uniform coverage, and within a specified thickness.

The chromium-plated nickel-based substrates are then thermally treated to interdiffuse the nickel and chromium atoms and to form an alloy of nickel and chromium alloys proximate the surface. The conditions under which the chromium plated nickel-based substrates are thermally treated are controlled such that any alloying proximate the surface occurs without excessive grain growth. The interdiffusion is preferably controlled in order to confine the diffusion of chromium to a depth of less than 10 $\mu$m from the new surface of the chromium-plated substrate or more preferably to a depth of about 5 $\mu$m from the original surface of the nickel-based substrate. This diffusion profile of the chromium surface treatment improves the cohesive arrangement of the chromium and nickel atoms and further develops a nickel—chromium alloy of inherently improved corrosion resistance and oxide forming capabilities should the chromium oxide layer be damaged or compromised.

The preferred temperature range of this thermal treatment ranges from between 700° C. and 1000° C., more preferably between about 725° C. and 850° C., and most preferably between about 760° C. and 790° C. for approximately two to three hours. Furthermore, the thermal treatment is conducted in an inert environment or a vacuum environment so as to prevent or minimize oxidation of the chromium or nickel during the diffusion and alloying of the metals. Essentially, the effect of the chromium diffusion into the nickel-based substrate is solid solution alloying in both the deposited layer and the near surface of the substrate.

FIG. 1 qualitatively depicts the change in chromium distribution in the near surface region of the nickel-based substrate before and after the interdiffusion provided by this first thermal treatment. As seen therein, the chromium concentration at the indicated depth from the new surface after the ion-plated chromium deposit is applied drops rapidly from over 90 weight percent chromium to less than 5 weight percent chromium within about a 1 $\mu$m distance. On the other hand, the weight percent of chromium detected at the indicated depth from the surface after the deposited substrate undergoes the first thermal treatment suggests the chromium atoms are diffusing further into the substrate and nickel atoms further towards the surface. Clearly, nickel atoms have diffused closer to the surface where a significant amount of nickel is found within 1 $\mu$m from the new surface of the chromium-plated component. Chromium atoms are found at depths of greater than 5 $\mu$m from the new surface of the chromium-plated component which translates to more than 3 $\mu$m into the nickel-based substrate from the original surface of the nickel-based substrate. This diffusion profile results in separate distinctive zones including a surface zone of predominantly chromium atoms, a zone of residual chromium that may exist immediately below the surface zone, and a near surface zone where a nickel—chromium alloy is formed. An important aspect of the preferred process is that the resulting nickel—chromium alloy zone is stable during normal operating temperatures of the air data sensor or probe.

A second thermal treatment is then applied to the treated substrate in an oxygen-containing atmosphere which develops a surface oxide layer of chromium oxide ($Cr_2O_3$) at the surface zone that operates as a corrosion barrier and can be tailored to provide a uniform surface appearance of various colors. This oxidation step is preferably performed under controlled conditions designed to optimize the structure, appearance and texture of the finished product. Of particular importance is the temperature range at which the second thermal treatment is performed. The temperature range of the second thermal treatment is preferably above the operating temperature of the probes yet not high enough to lead to significant diffusion of chromium out of the surface. The preferred temperature range of this second thermal treatment is between about 400° C. and 1000° C. and more preferably between about 600° C. and 800° C. and most preferably between about 625° C. and 675° C. The preferred oxidation step is carried out in an oxygen-containing atmosphere, such as air, at standard atmospheric pressure. Pure oxygen or a mixture of oxygen and an inert gas, e.g., argon, might alternatively be used and changes can be made in the pressure or in the humidity of ambient air if desired. The duration of the oxidation step can range from between about 10 minutes to several days and preferably lasts about 5 to 6 hours.

It was observed that the color appearance of the finished air data sensor or probe varies as a function of the chromium oxide layer thickness that develops during the second thermal treatment. Accordingly, by adjusting the time, temperature and optionally the partial pressure of oxygen, the surface appearance can be altered without significantly affecting the integrity of the surface treatment. The perceived color of the treated surface is a combination of the underlying nickel based substrate, the chromium oxide layer and the optical interference of the chromium oxide layer with ordinary white light. The most stable form of chromium oxide is green in color. The colors observed in the treated air data sensors cover a range varying from yellow to blue which represent wavelengths in the range of approximately 400–500 nanometers. For the yellow to blue interference patterns to develop, the chromium oxide film thickness is at least $\lambda/4\mu$, where $\lambda$ is the wavelength and $\mu$ is the index of refraction which is approximately 2.5 for chromium oxide. This translates to a chromium oxide film thickness of between about 40–50 nanometers. A darker more uniform color is obtained at higher temperatures and longer exposure times. Cleaning the sensors prior to the first and second thermal treatments is preferred in order to maintain color uniformity and to avoid discolorations due to the presence of contaminants or fingerprint markings.

Figure 2:
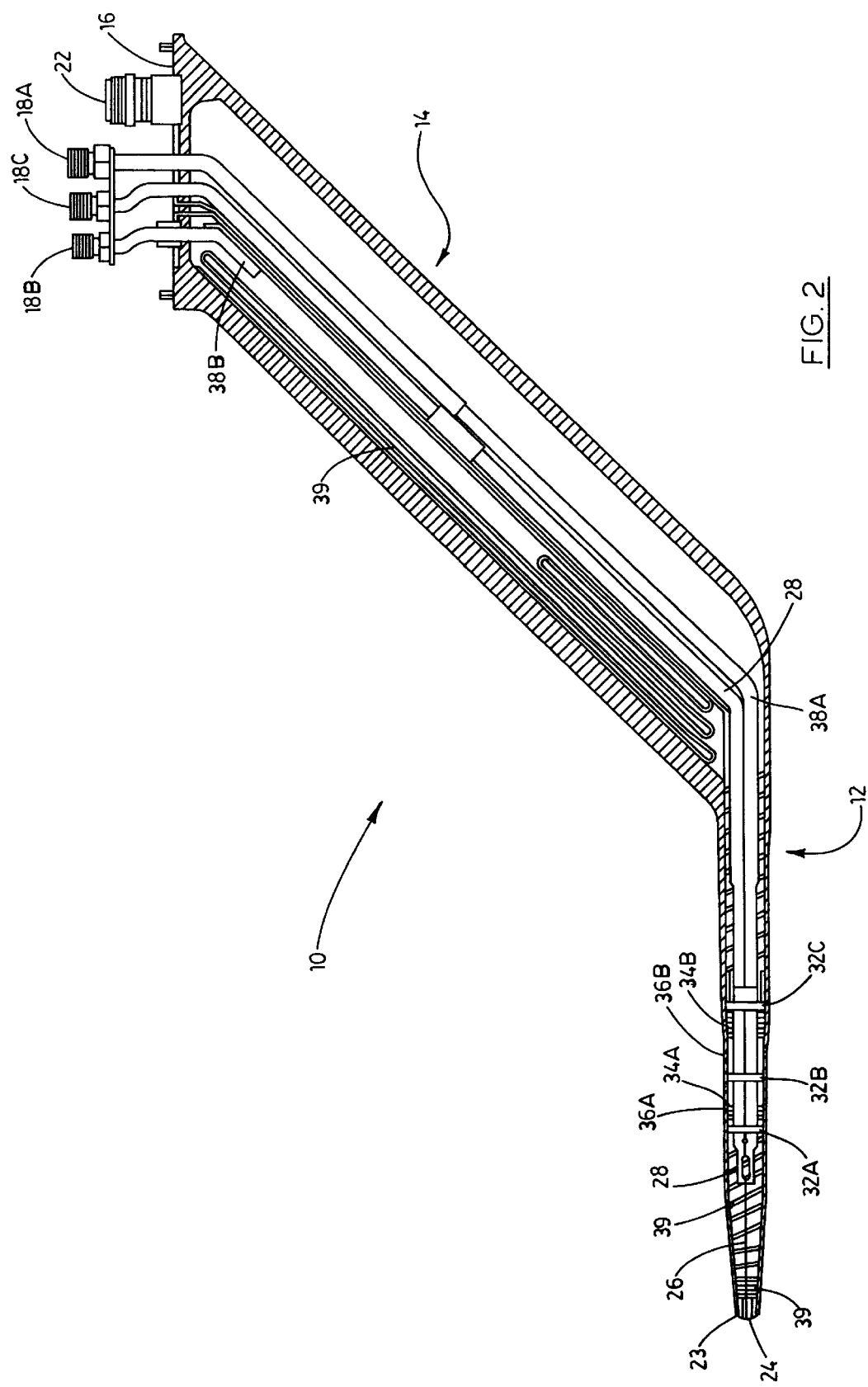
FIG. 2 is a schematic view of an air data probe illustrating a nickel-based sensing element extending from the pitot strut. This pitot static tube is one of many types of air data sensors suitable for receiving the chromium surface treatment of the present invention.

In FIG. 2, the illustrated air data probe is a typical pitot static sensing probe 10 which consists of a nickel-based sensing element 12 extending from a strut 14. While the sensing element 12 illustrated here is strut-mounted, alternative mounting arrangements are contemplated including direct mounting on a wing, on a boom or on other control surfaces. In the illustrated embodiment, the strut 14 extends from a base member 16 which is adapted for external mounting on an air vehicle (not shown). A plurality of sensor fittings 18A, 18B, 18C and an electrical connector 22 extend from the base plate 16 to the appropriate instrumentation within the air vehicle. The forward end 23 of the sensing element 12 has a pitot inlet port 24 which faces forward and opens into a pitot pressure chamber 26. Within the pitot pressure chamber 26, there is a pitot sensing tube 28 adapted for sensing the impact of the air flow stream on the probe. A plurality of aft bulkheads 32A, 32B, 32C in the interior of the sensing element 12 separate the pitot pressure chamber 26 from aft sensing chambers 34A and 34B. Each aft sensing chamber 34A and 34B, preferably has a small static sensing port 36A and 36B, and a static pressure sensing tube 38A and 38B, which leads from the aft sensing chambers 34A and 34B through the strut 14 and on to the appropriate aircraft instruments. Located throughout the sensing element 12 and strut 14, there are internally placed heater coils 39 suitable for use during anti-icing and deicing procedures.

Figure 3:
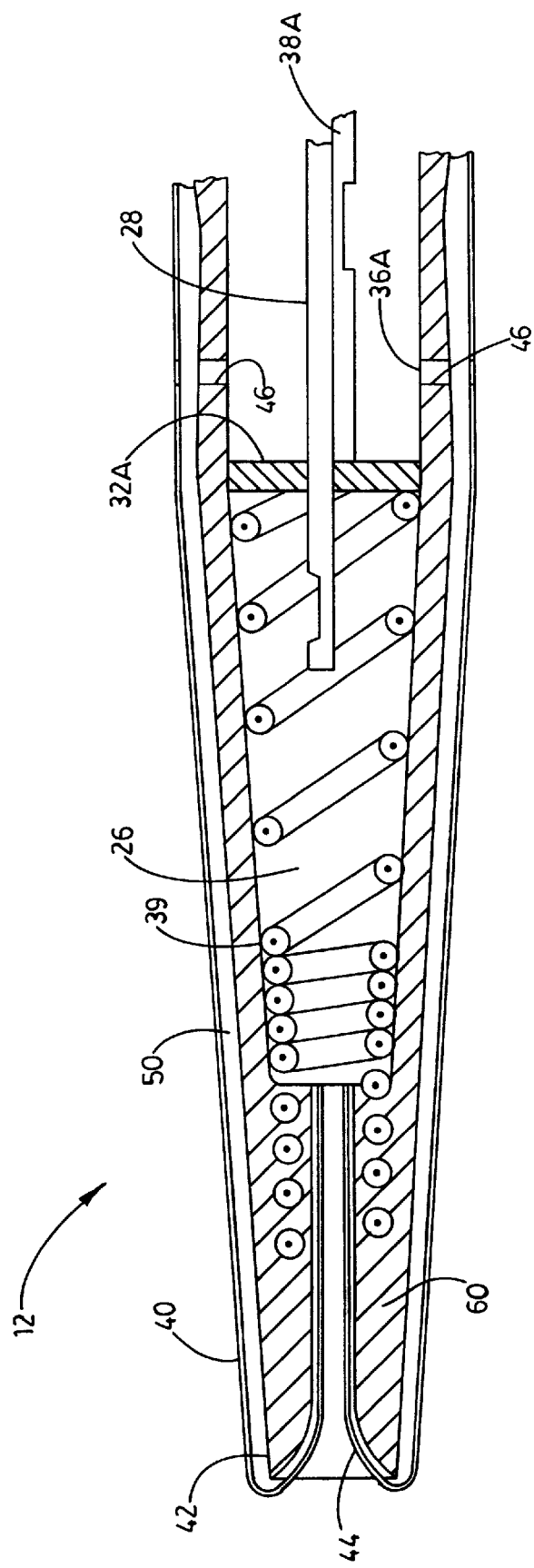
FIG. 3 is a partial sectional view of the chromium surface treated nickel-base sensing element. The dimensions of the chromium surface treated nickel-base sensing element are exaggerated for the purpose of more clearly illustrating the present invention.

As seen in FIG. 3, a partial sectional view of the sensing element 12, the dimensions of which are exaggerated, shows the sensing element 12 as having a chromium oxide layer 40 formed on the exterior exposed surfaces 42 of the sensing element 12, on the pitot inlet port walls 44 and on the static sensing port walls 46. Moreover, a layer of nickel—chromium alloy 50 is disposed immediately below the chromium oxide layer 40. Although not shown in the illustration, it is possible for some residual chromium to remain between the chromium oxide layer 40 and the layer of the nickel—chromium alloy 50. In either situation, the layer of nickel—chromium alloy 50 is disposed on the nickel-based body 60 of the sensing element 12. As indicated above, the chromium oxide layer 40 preferably has a thickness of between about 40–50 nanometers while the layer of nickel—chromium alloy 50 can range up to about 10 $\mu$m thick. Such a layering arrangement of chromium oxide, nickel—chromium alloy and the nickel-based body of the sensing element provides an air data probe that retains the requisite thermal conductivity while demonstrating enhanced corrosion resistance properties.

The following are descriptive examples of the application of a chromium surface treatment to nickel-based substrates; comparative corrosion tests of the chromium treated nickel-based substrates; and surface appearance and color control of treated air data sensors. It is not intended that the scope of this invention be limited to these specific examples described. Rather, it is intended that the scope of the invention be determined by the appending claims and their equivalents.

EXAMPLE 1

Chromium Surface Treatment

The ion-aided depositing techniques used in the present example was an electron beam ion plating process of the type known in the art and generally available from numerous commercial firms or specialists within the ion plating industry. The plasma ion depositing process was performed in an evacuated plasma ion plating chamber where multiple test specimens of the nickel-based substrates were suspended. For purposes of this example, the nickel-based test specimens were comprised of Nickel 200 annealed sheet product form and were dimensioned at 2.5 cm×10 cm×0.25 cm. Multiple holes were drilled in the test specimens to simulate the sizes of the ports used in standard pitot tube designs and were approximately 2.0 mm and 1.0 mm in diameter. The test specimens were cleaned and then placed in the plasma ion plating chamber with a chromium electrode. A cloud of charged chromium ions was produced within the plating chamber and the charged chromium ions were deposited on the oppositely charged test specimens. The plasma ion deposition process conditions included a bias potential of approximately 1000–2000 volts, a current of about 10 mA and a chamber pressure of approximately $10^{-2}$ Pa. The ion plating process was controlled to prevent overheating of the bulk substrate by adjusting the applied voltage and currents. The chromium depositing process was completed in about one hour.

This electron beam ion plating process resulted in a chromium deposit on the exterior surface of the Nickel 200 substrate of about 1.7 $\mu$m±0.7 $\mu$m. The chromium deposit was adherent and was fairly uniform for each sample. No flaking of the chromium layer was evident. The chromium deposit was found to cover all surfaces, including the walls of the openings or ports. The chromium deposits on the port walls was approximately 0.3 μm (nominal), thinner than the exterior chromium deposits.

The ion-aided chromium depositing treatment was preferably followed by two independent and distinct thermal treatments. In the first thermal treatment sequence, the ion plated samples were thermally treated to interdiffuse the nickel and chromium atoms and to form an alloy of nickel chromium at the surface. The conditions were chosen to accomplish this alloying without excessive grain growth. Temperature range of this thermal treatment ranged from between 760° and 790° C. at a pressure of approximately $10^{-3}$ Pa. The nickel-based substrates were subjected to this first thermal treatment for between two to three hours.

The chromium-plated microstructure was characterized by standard metallographic methods and electron microscopy both before and after the initial thermal treatment. The composition was studied by using an Energy Dispersive X-Ray (EDX) analysis system associated with the scanning electron microscope (SEM) equipment. The surface analysis provided quantitative data points of FIG. 1 and presented in Table 1 within the accuracy of the EDX analysis, which show the chromium atoms are diffusing further into the substrate and nickel atoms further towards the surface. The surface analysis also indicated that excessive grain growth in the nickel—chromium alloys was avoided and that good adherence of the chromium deposit to the substrate was preserved.

TABLE 1

Chromium Distribution in Near Surface Region

| After Ion-Deposition Process | | After First Thermal Treatment | |
|---|---|---|---|
| Depth From Surface | Weight Percent Chromium | Depth From Surface | Weight Percent Chromium |
| 0.83 μm | 97.0% | 0.67 μm | 44.9% |
| 2.33 μm | 2.1% | 2.17 μm | 23.3% |
| 3.67 μm | 1.1% | 3.33 μm | 13.4% |
| 4.67 μm | 0.9% | 5.00 μm | 5.0% |
| ** | ** | 6.33 μm | 0.6% |

After the samples were subjected to the first thermal treatment, they were processed under controlled conditions which developed a thin surface oxide layer of chromium oxide ($Cr_2O_3$), on the order of between about 20 and 80 nanometers thick which functions as a protective layer and provides a uniform surface appearance. The controlled conditions for the second thermal treatment were selected to be above the normal operating temperatures of the air data probes (>400° C.). These conditions provided oxidation of the chromium and did not lead to significant diffusion of the chromium out of the surface nor further significant diffusion into the substrate. This second thermal treatment was performed at a temperature of about 500° C. for approximately one hour in a standard laboratory air atmosphere containing ambient humidity.

EXAMPLE 2

Corrosion Test of Treated Nickel Component

Another test specimen in the shape of an air data probe was prepared by selecting a Nickel 211 alloy tube approximately 2.1 cm in diameter and 11.5 cm long. A heater element typically used in aircraft pitot probes was brazed in the tube. The test specimen was treated by the preferred three step chromium surface treatment process described above.

The test specimen was then subjected to an accelerated corrosion test. The accelerated corrosion test involved cycling the heater element within the test specimen on and off continuously until the appearance of significant corrosion. The heater element was cycled for 10 minutes in an on state followed by a 15 minute off state in a continuously repeating cycle. The test specimen was suspended over a tank of simulated sea water for the duration of the test and regularly sprayed with the simulated sea water solution for approximately ten seconds immediately preceding each activation of the heater element. The simulated sea water solution was sprayed over the exterior surfaces of the test specimen. The simulated sea water solution used in the accelerated corrosion test consisted of 23 g of NaCl; 8 g of $Na_2SO_4.10\ H_2O$; 0.2 g of KCl; 0.9 g of KBr; 11 g of $MgCl_2.6\ H_2O$; 2.2 g of $CaCl_2.6\ H_2O$; and enough distilled water to make 1.0 liter.

The test specimen was subjected to this accelerated corrosion test for 30 days with no visible exterior corrosion. By way of comparison, untreated nickel probes typically show non-uniform corrosion modes after about one day of the accelerated corrosion test and typically exhibit major corrosion after about seven days.

EXAMPLE 3

Surface Appearance of Treated Air Data Sensor

Six samples consisting of portions of a nickel-based air data probe were plated with chromium and subjected to the first thermal treatment described above. The samples were then subjected to the above-described second thermal treatment at various temperatures and for varying lengths of time in order to obtain different surface appearances of the samples. The surface appearance of the samples was dependent on the thickness of the chromium oxide layer which is a function of the time, temperature and pressure of the second thermal treatment. The partial pressure of oxygen in air at atmospheric pressure containing ambient humidity was used to oxidize all six samples. The effects of time and temperature were examined as the samples were thermally treated in a resistively heated laboratory furnace. The treated samples were thoroughly cleaned prior to the second thermal treatment to remove any grease and oils including fingerprints from handling of the parts. Some of the samples were cleaned with acetone, followed by trichloroethane and finally wiped off with ethanol. Table 2 identifies the conditions of this second thermal treatment and the resulting color appearance of the samples.

TABLE 2

Surface Appearance of Treated Samples

| Sample | Thermal Treatment Temperature | Thermal Treatment Time | Air Pressure | Color Appearance |
|---|---|---|---|---|
| 11095-18-2 | 500° C. | 1 hour | Atmospheric | Gold-Brown |
| 11095-19-1 | 600° C. | 1 hour | Atmospheric | Steel-Blue |
| 11095-19-2 | 650° C. | 1 hour | Atmospheric | Blue-Gray |
| 11095-19-3 | 700° C. | 1 hour | Atmospheric | Gray-Brown |
| 11095-20-1 | 650° C. | 2 hours | Atmospheric | Gold-Brown |
| 11095-50-2 | 650° C. | 42 hours | Atmospheric | Dary Gray |

From the foregoing, it should be appreciated that the present invention thus provides a method for applying a chromium surface treatment of nickel-based substrates that provide enhanced corrosion resistance while retaining the thermal conductivity and other preferred mechanical properties of the nickel-based substrate. Further, it will be apparent that various changes may be made in the particular variables and conditions identified in the preferred steps including process temperatures, times, pressures, materials, and substrate dimensions without departing from the spirit and scope of the invention or sacrificing all of its material advantages, the processes hereinbefore described being merely exemplary embodiments thereof.

What is claimed is:

1. An air data sensing probe including a sensing means and a probe body, said probe body comprising:
   a nickel-based substrate;
   an interdiffused region of nickel chromium alloys proximate an outer surface of said substrate, said interdiffused region formed by disposing chromium on said nickel-based substrate and interdiffusing said chromium therewith; and
   a chromium oxide layer formed on said interdiffused region of nickel chromium alloys.

2. The air data sensing probe of claim 1 wherein said nickel-based substrate further comprises a metal substrate composed of a high nickel content alloy containing at least 90% nickel by weight.

3. The air data sensing probe of claim 1 wherein said interdiffused region of nickel chromium alloys has a thickness of between about 1 $\mu$m to about 10 $\mu$m.

4. The air data sensing probe of claim 1 further comprising a region of non-alloyed chromium atoms interposed between said region of nickel chromium alloys and said chromium oxide layer.

5. The air data sensing probe of claim 1 wherein said interdiffused region of nickel chromium alloys has a graded concentration of chromium as a function of the depth from said outer surface of said substrate.

6. The air data sensing probe of claim 5 wherein said interdiffused region of nickel chromium alloys has a decreasing concentration of chromium as the distance from said outer surface of said substrate increases.

7. The air data sensing probe of claim 1 wherein said air data sensing probe has at least one measurement port associated with said sensing means, and said chromium oxide layer is further disposed on an interior surface of said measurement port.

8. The air data sensing probe of claim 1 wherein said chromium oxide layer has a thickness of between about 20 and 80 nanometers.

9. An air data sensing probe including a sensing means and a probe body, said probe body comprising:
   a chromium treated nickel-based substrate having chromium atoms disposed on and interdiffused with nickel atoms of said nickel-based substrate forming nickel chromium alloys; and
   a chromium oxide layer formed on an outer surface of said chromium treated nickel-based substrate.

10. The air data sensing probe of claim 9 wherein said air data sensing probe has at least one measurement port associated with said sensing means, and said chromium oxide layer is further disposed on an interior surface of said measurement port.

11. The air data sensing probe of claim 9 wherein said chromium oxide layer has a thickness of between about 20 and 80 nanometers.

12. The air data sensing probe of claim 9 wherein said substrate is a high nickel content alloy containing at least 90% nickel by weight.

13. The air data sensing probe of claim 9 wherein said chromium treated, nickel-based substrate further includes a region of chromium nickel alloys resulting from the interdiffusion of the nickel and chromium, said region of chromium nickel alloys disposed underneath said chromium oxide layer to a depth of up to about 10 $\mu$m into said substrate.

14. The air data sensing probe of claim 13 wherein said chromium treated, nickel-based substrate further includes a region of non-alloyed chromium atoms interposed between said region of nickel chromium alloys and said chromium oxide layer.

15. The air data sensing probe of claim 13 wherein said chromium treated, nickel-based substrate has a graded concentration of chromium as a function of the depth from said outer surface of said substrate.

16. The air data sensing probe of claim 13 wherein said chromium treated, nickel-based substrate has a decreasing concentration of chromium as the distance from said outer surface of said substrate increases.

17. An air data sensing probe including a probe body, said probe body comprising:
   a nickel-based substrate;
   an interdiffused region of nickel chromium alloys disposed on said substrate, said interdiffused region formed by disposing chromium on said nickel-based substrate and interdiffusing said chromium therewith,
   a chromium oxide layer formed on said interdiffused region of nickel chromium alloys; and
   a region of non-alloyed chromium atoms interposed between said region of nickel chromium alloys and said chromium oxide layer.

18. An air data sensing probe including a sensing means and a probe body, said probe body comprising:
   a chromium treated nickel-based substrate having chromium atoms disposed on and interdiffused with nickel atoms of said nickel-based substrate forming nickel chromium alloys;
   a chromium oxide layer formed on an outer surface of said chromium treated nickel-based substrate; and
   said chromium treated, nickel-based substrate further includes a region of non-alloyed chromium atoms interposed between said region of nickel chromium alloys and said chromium oxide layer.

* * * * *